(12) United States Patent
Shanbhag

(10) Patent No.: US 7,026,873 B2
(45) Date of Patent: Apr. 11, 2006

(54) LMS-BASED ADAPTIVE PRE-DISTORTION FOR ENHANCED POWER AMPLIFIER EFFICIENCY

(75) Inventor: Abhijit G. Shanbhag, San Jose, CA (US)

(73) Assignee: Scintera Networks, San Jose, CA (US)

( * ) Notice: Subject to any disclaimer, the term of this patent is extended or adjusted under 35 U.S.C. 154(b) by 0 days.

(21) Appl. No.: 10/704,439

(22) Filed: Nov. 7, 2003

(65) Prior Publication Data

US 2005/0099230 A1    May 12, 2005

(51) Int. Cl.
*H03F 1/26*    (2006.01)

(52) U.S. Cl. .................. 330/149; 330/126; 375/297; 455/114.3

(58) Field of Classification Search .................. None
See application file for complete search history.

(56) References Cited

U.S. PATENT DOCUMENTS 5,892,397 A * 4/1999 Belcher et al. .............. 330/149
6,133,789 A * 10/2000 Braithwaite ................. 330/149
6,356,146 B1 * 3/2002 Wright et al. ............... 330/149

* cited by examiner

*Primary Examiner*—Khanh V. Nguyen
(74) *Attorney, Agent, or Firm*—MacPherson Kwok Chen & Heid LLP; Tom Chen (57) ABSTRACT

Systems and methods are disclosed to adaptively pre-distort a signal prior to being used by a non-linear circuit, such as a higher power amplifier (at transmit) or a low noise amplifier (at receive). The signal is compared with a feedback signal from the non-linear circuit and a metric is calculated and minimized. The input signal is adaptively changed, such as by varying tap coefficients, until the metric is sufficiently minimized, resulting in a pre-distorted signal that is substantially linear upon passing through the non-linear circuit.

21 Claims, 9 Drawing Sheets

LMS-BASED ADAPTIVE PRE-DISTORTION FOR ENHANCED POWER AMPLIFIER EFFICIENCY

TECHNICAL FIELD

This invention relates generally to communication systems and, more particularly, to pre-distortion circuitry for use with power amplifiers.

BACKGROUND

Many types of communication systems use a power amplifier as part of the front end of a transmitter for transmitting RF signals. In some systems, a low noise amplifier (LNA) at the front end of a receiver may be used for receiving RF signals. However, a power amplifier has non-linear distorting characteristics that can cause distortion of the information signal being amplified. The non-linear distorting characteristics of the power amplifier can impact the instantaneous amplitude and phase of the signal significantly. Furthermore, non-linearity within the RF components can introduce distortion in the signal and reduced SNR or poorer performance at the receiver. In wireless systems, non-linearity in the power amplifier at transmission can introduce intermodulation distortion which can result in spectral emissions in the adjacent channels. Typically, tight specifications in terms of spectral masks are provided by Standards Committees and/or Government bodies, which put a maximum limit to such spurious, out-of-band emissions for compliant transceivers. Therefore, it is desirable to provide a linear signal out of the power amplifier.

One type of method to linearize the power amplifier output signal is to "pre-correct" the signal being input to the amplifier, also known as pre-distortion. There are many known techniques are used to pre-correct an information signal in order to linearize the output of the amplifier. One of these techniques involves amplitude correction which produces a linear piece-wise pre-correction function which is correlated to the non-linear characteristics of the amplifier. The result is a piece-wise correction curve which approximates the ideal correction. The correction is then added to the information signal.

Pre-distortion has been almost exclusively in the baseband domain. The typical approach has been to apply a pre-distortion function at digital baseband. A relatively recent but commonly used approach has been to store the pre-distortion function as a look-up table which stores the gain and phase values as a function of the input signal envelope. The input signal is compared with the feedback signal from the power amplifier and certain metrics, such as ratio of in-band to out-of-band emission power and/or their correlation are used to adaptively map the look-up table with respect to the envelope of the input signal. Thus, the data path is simply a complex multiplication at digital baseband; the adapt-path (or feedback path) consists of a look-up table indexed by the input signal envelope and the adaptation metric is the ratio of in-band to out-of-band emission or the correlation between the feedback and the input signals. These operations are carried out at digital baseband.

However, increasing the linearity of the power amplifiers can reduce the power efficiency of the amplifiers, make them more voluminous, require more cooling equipment, and substantially increase the cost and form-factor of the transceivers. To improve the linearity of the transmission without resorting to a higher end and more expensive power amplifier, one method that has been carried out in the prior art is to perform pre-distortion on the transmitted signal before the signal is input into the power amplifier such that the pre-distortion equalizes in some sense the non-linear post-distortion of the amplifier. The pre-distortion may be carried out within an integrated circuit; however, a significant challenge has always been to be able to adaptively obtain the pre-distortion transfer function so as to be optimal in some metric. It is also desirable to have a tracking mechanism with the pre-distortion so that different temperature and aging effects are also compensated for.

Accordingly, it would be desirable to have systems and methods for performing pre-distortion in power amplifiers that overcome the disadvantages of the prior art as discussed.

SUMMARY

According to one aspect of the present invention, adaptive pre-distortion is performed using a least-mean square (LMS) method to adaptively obtain an optimal pre-distortion transfer function in the mean square error sense. In one embodiment, a LMS-based adaptive pre-distortion circuit coupled between an input signal to be transmitted and a non-linear power amplifier compares the input signal to a feedback signal from the power amplifier. The circuit adaptively reduces the least-mean square error between the two signals using both linear and non-linear filters and various feedback signals within the circuit. The result is an approximately linear output from the power amplifier. This technique can be used with single and multi-carrier transceivers, as well as with either a power amplifier (at the transmitter) or low noise amplifier (LNA) (at the receiver). The adaptive pre-distortion can be performed in the baseband domain or purely in the RF domain, using analog continuous-time or discrete-time signal processing.

According to one embodiment, an LMS-based adaptive pre-distortion (LAPD) circuit receives an input signal to be transmitted, such as from a baseband processor and RF circuitry, and a feedback signal from a power amplifier. The LAPD circuit adaptively minimizes a metric, such as an error signal, formed by the difference between the two signals. The LAPD circuit receives the input signal through an adaptive AGC circuit. The LAPD circuit further includes a feedforward filter, an adaptive coefficient generator, a slicer, timing control circuit, and slicer output time-align circuit. An error timing align circuit within the adaptive coefficient generator may be used to time align the input signal from the adaptive AGC circuit with the error signal e(t) or equalize delays between the input signal and the error signal. The error timing align circuit may receive as an input signal a feedback tap coefficient vector c or the error signal e(t). The timing control circuit time aligns or equalizes the delays between the input signal and the feedback signal from the power amplifier to compute an error signal, which is the time difference between the two signals. This error signal is iteratively reduced until a desired signal is obtained. The output signal is then input to the non-linear power amplifier, which amplifies the signal for transmission, resulting in a linearized output signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
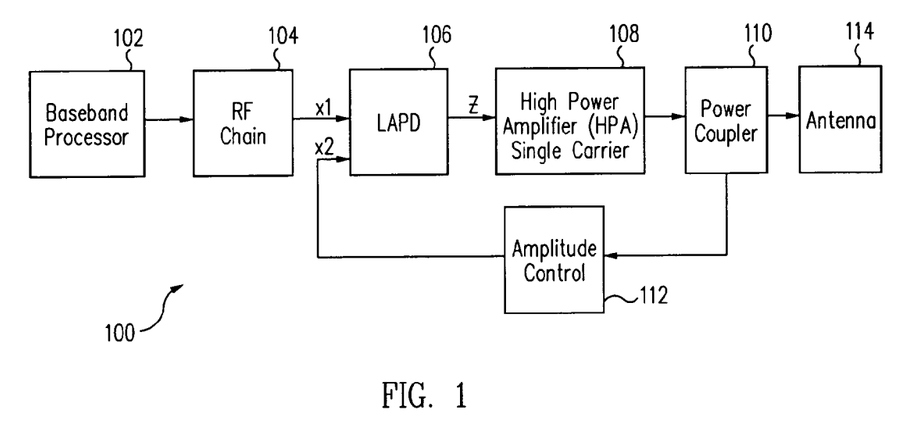
FIG. 1 shows a block diagram of a portion of a single-carrier transceiver with adaptive pre-distortion according to one aspect of the present invention.

FIG. 1 is a block diagram of a portion of an RF communication system 100 for transmitting RF signals. System 100 includes a baseband processor 102 as part of a single carrier transceiver that generates signals in baseband to be transmitted. These signals are input to one or more RF circuits 104 that translate the signals to the RF domain. A least-mean square (LMS) based adaptive pre-distortion (LAPD) circuit 106 processes the desired signal (x1) to be transmitted from RF circuits 104 and feedback signals (x2) from a single carrier power amplifier 108 to generate a pre-distorted signal to power amplifier 108. LAPD circuit 106 adaptively pre-distorts the input signal such that after traveling through power amplifier circuit 108, the signal is linear. Note that with conventional systems, LAPD circuit 106 is replace by a look-up table that compares the two input signals and assigns specific values to the signal for pre-distortion.

System 100 further includes a power coupler 110 that receives the output signal from power amplifier 108 and splits a portion of the input RF signal into the feedback path and passes the rest of the signal through to the antenna for transmission. The output signal from power coupler 110 is received by an amplitude control or controllable gain circuit 112, which then scales the signal so that the signal input into LAPD circuit 106 is within an admissible range for operation of the LAPD circuit. Controllable gain circuit 112 feeds the signal back to LAPD circuit 106 for comparing with the desired signal to be transmitted. Power coupler 110, after receiving the signal from power amplifier circuit 108, sends the signal to an antenna 114 for transmission. After adaptive pre-distortion by LAPD circuit 106, the signal from power amplifier circuit 108 is essentially linear.

Figure 2:
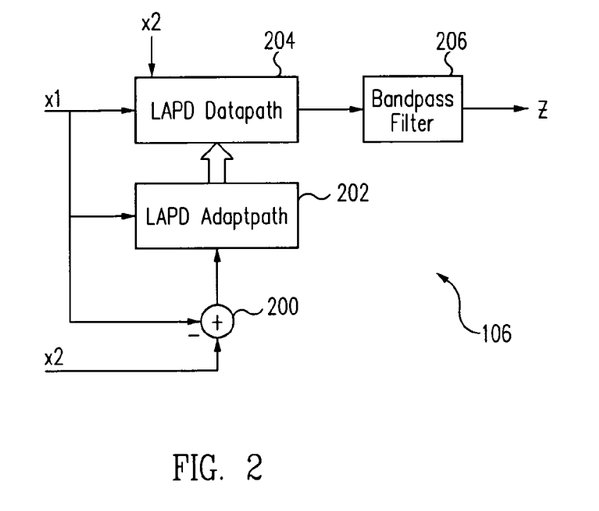
FIG. 2 shows a block diagram of a pre-distortion circuit for use in the transceiver of FIG. 2 according to one embodiment.

FIG. 2 is a block diagram of LAPD circuit 106 according to one embodiment of the invention. LAPD circuit 106 includes an adder 200 that calculates the difference between the input signal (x1) from RF circuits 104 and the feedback signal (x2) from power amplifier circuit 108. Signal x2 will sometimes be referred to as the feedback signal from power amplifier 108. However, it is recognized that feedback signal x2 may actually pass from power amplifier 108 through power coupler 110 and amplitude control circuit 112. Thus, a feedback signal from the power amplifier or a low noise amplifier (or other non-linear element) can be any signal that passes through one or more circuit elements before entering LAPD circuit 106 and does not require a direct signal from the power amplifier to the LAPD circuit. The output signal e(t) of adder 200 (i.e., the difference or error signal) is input to an LAPD adaptpath circuit 202, which provides adaptive tap coefficients or vector c from the error signal e(t) and the input signal x1. Note that as used herein, adaptpath indicates circuitry that adaptively changes a signal. The tap coefficients c, along with input signal x1, are then input to an LAPD datapath circuit 204, which generates an pre-distorted signal z(t). LAPD datapath circuit 204 pre-distorts the signal based on a set of configuration parameters (or tap weights) which are controlled by LAPD adaptpath circuit 202 based on minimizing a certain metric, such as mean squared amplitude of the input signal into the LAPD and the amplitude control circuit output. The signal is then filtered through a bandpass filter 206 for transmission to the power amplifier. In one embodiment, bandpass filter 206 is part of LAPD circuit 106, while in another embodiment, bandpass filter 206 is external to LAPD circuit 106.

Figure 3A:
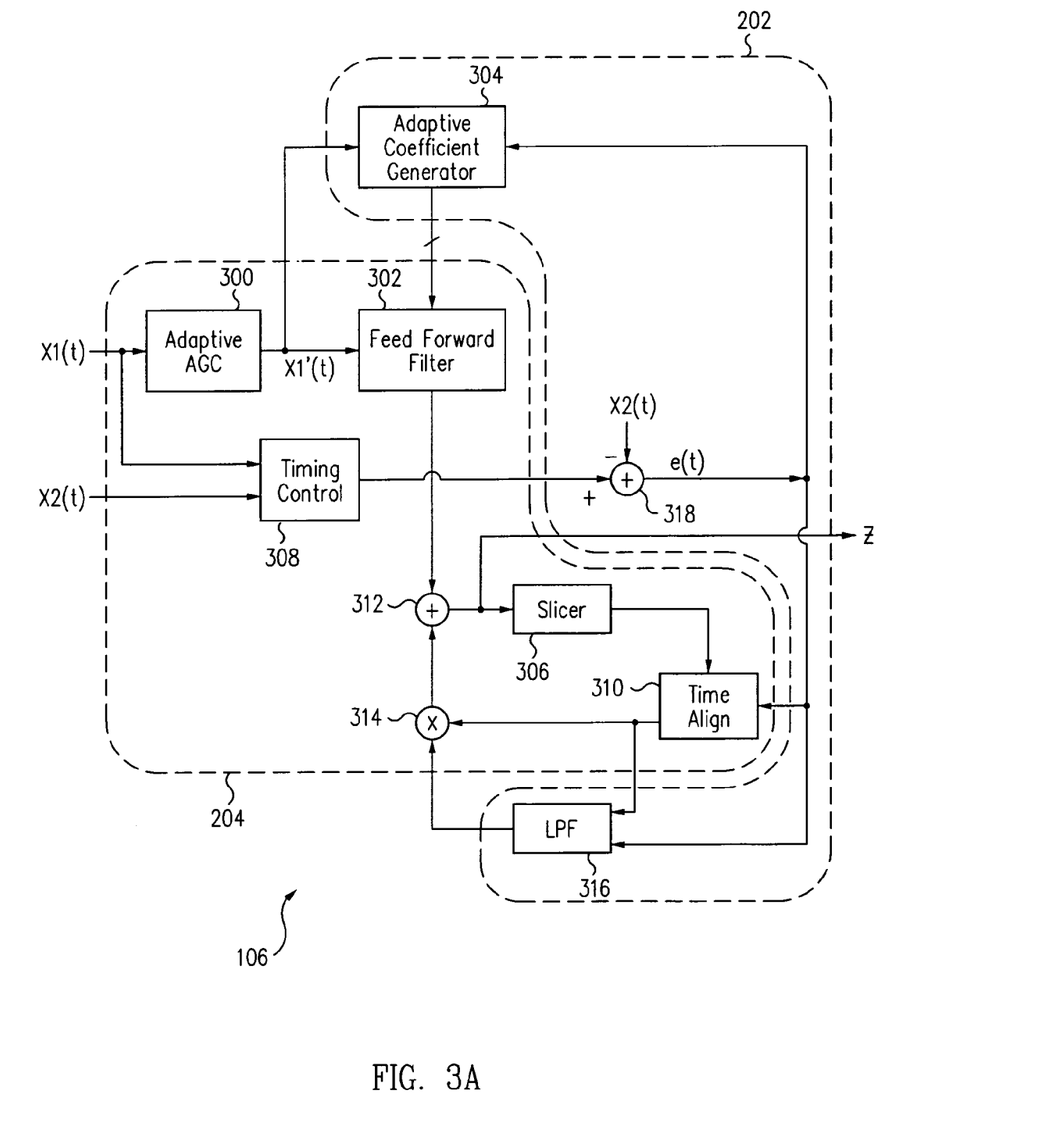
FIG. 3A shows a more detailed block diagram of the pre-distortion circuit of FIG. 2 according to one embodiment.

FIG. 3A is a more detailed block diagram of LAPD circuit 106 of FIGS. 1 and 2 according to one embodiment. LAPD circuit 106 includes an adaptive automatic gain control (AGC) circuit 300 within LAPD adaptpath circuit 202, which provides the necessary gain for small signals. Thus, after a signal is output from AGC circuit 300, the signal is within a suitable range that allows the signal to be properly used throughout the rest of the circuit. Adaptive AGCs are known and any such suitable one can be used with the present invention to adaptively provide the proper gain. LAPD circuit 106 also includes a feedforward filter 302, an adaptive coefficient generator 304, an output signal slicer 306, a timing control or time-align circuit 308, and a slicer output time-align circuit 310. Within LAPD circuit 106 is LAPD adaptpath circuit 202, which includes adaptive coefficient generator 304, an adder 318, and an integrator, such as a low pass filter block 316, and LAPD datapath circuit 204, which includes adaptive AGC circuit 300, feedforward filter 302, timing control circuit 308, output signal slicer 306, slicer output time-align circuit 310, an adder 312, and a multiplier 314.

Input signal x1 is received by adaptive AGC circuit 300. Feedforward filter 302 receives the output signal x1' from adaptive AGC circuit 300 and tap coefficients from adaptive coefficient generator 304 and generates a pre-distorted signal, which is input to adder 312. The other input to adder 312 is the product 314 of the output of low pass filter block 316, and slicer output time-align circuit 310.

The feedback signal (from product 314) into adder 312 provides an iterative correction to an error signal e(t) for use by adaptive coefficient generator 304 to generate adaptive tap coefficients. The error signal, processing through adder 318, is the difference between the output of timing control circuit 308 and input signal x2 (the feedback signal from the power amplifier). As time passes, the error signal converges until a sufficiently small error signal is obtained through adaptively changing the tap coefficients.

Figure 3B:
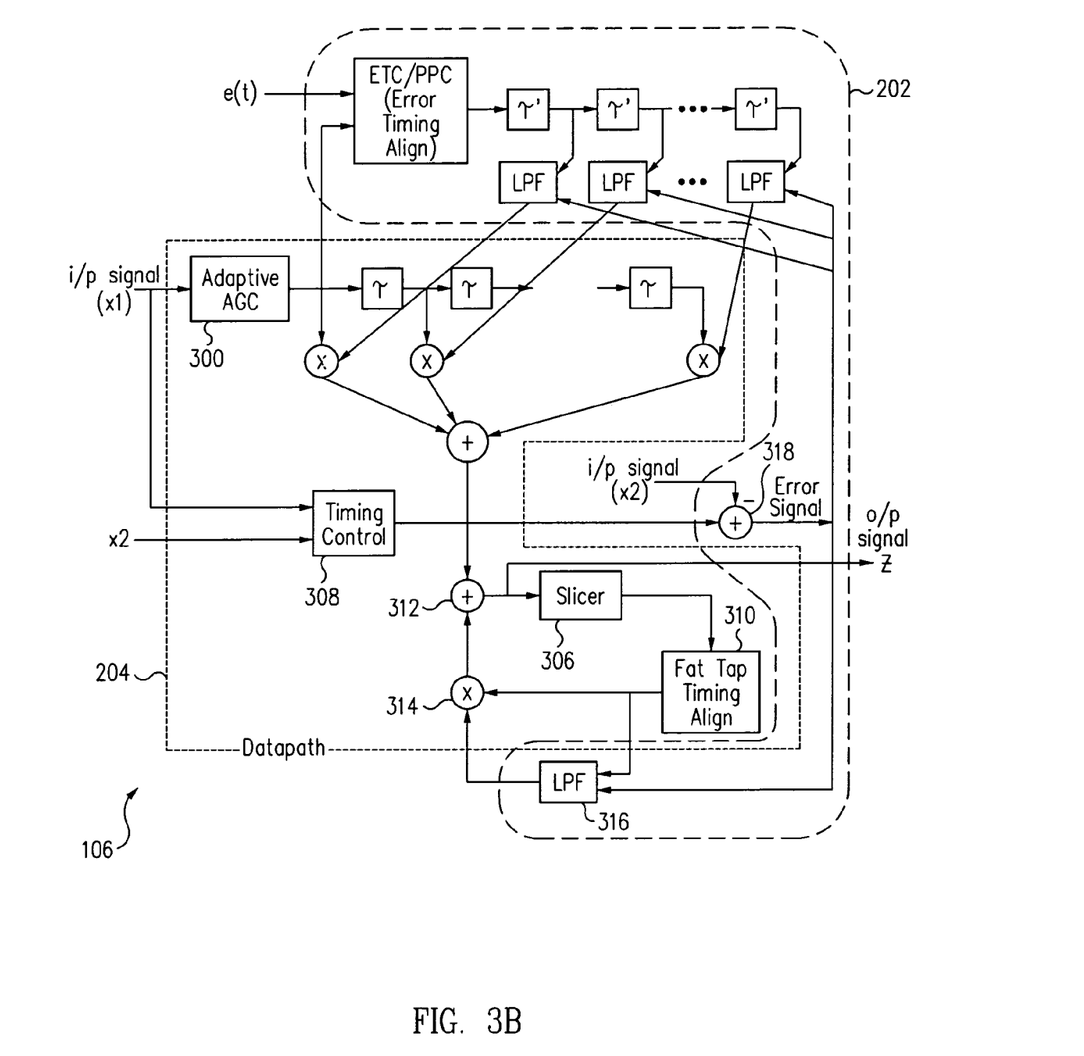
FIG. 3B shows one embodiment of the pre-distortion circuit of FIG. 3A with a more detailed feedforward filter and adaptive coefficient generator.

FIG. 3B is a more detailed block diagram of LAPD circuit 106 according to one embodiment, in which adaptive coefficient generator 304 and feedforward filter 302 are shown in greater detail. Details will be discussed further below.

Figure 4:
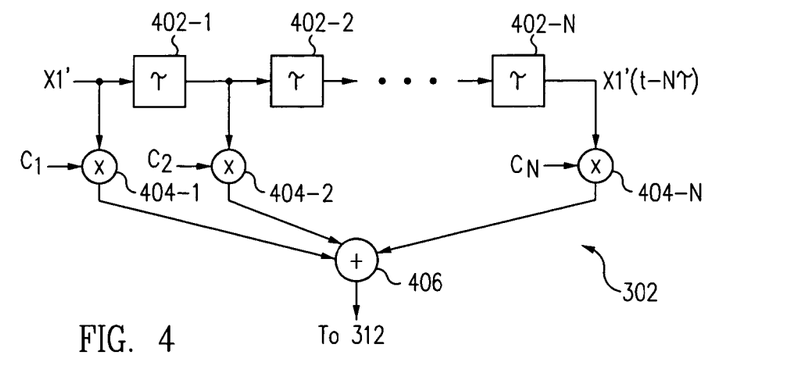
FIG. 4 shows one embodiment of a feedforward filter in FIG. 3A.

FIG. 4 shows one embodiment of a feedforward filter suitable for use as feedforward filter 302 of FIG. 3A. The feedforward filter includes a series of signal delay elements 402-1 to 402-N. Each delay element 402 delays the incoming signal by a fixed amount $\tau$, e.g., x1'(t−$\tau$), x1'(t−2$\tau$), . . . x1'(t−N$\tau$). The delay $\tau$ is typically selected to be less than a symbol period, and in one embodiment, is based on the symbol period $T_s$ and the number of feedforward taps N as follows:

$$\tau = \frac{T_s}{N-1}$$

The input data signal x1'(t) and each successive delayed signal from delay elements 402-1 to 402-N are multiplied by multipliers 404-1 to 404-N with its respective adaptive coefficient signals from adaptive coefficient generator 304. The product signals are then summed by an adder circuit 406 to form the pre-distorted signal.

Figure 5:
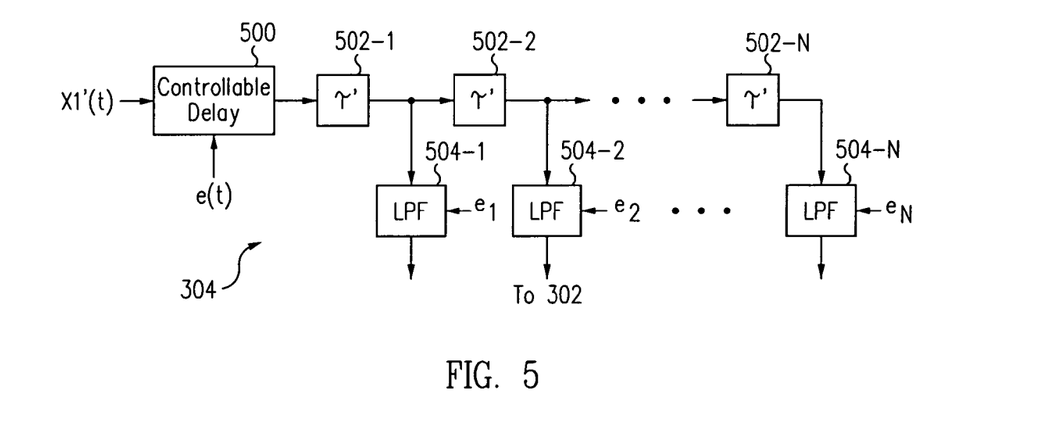
FIG. 5 shows one embodiment of an adaptive coefficient generator of FIG. 3A.

FIG. 5 shows one embodiment of an adaptive coefficient generator for use as adaptive coefficient generator 304 of FIG. 3A. The generator includes a controllable delay 500, which receives input data signal x1'(t) and the error signal e(t), and introduces a fixed delay into the signal. One type of controllable delay suitable for the present invention is an error timing control (ETC) and precursor/postcursor control (PPC) circuit, such as described in commonly-owned U.S. patent application Ser. No. 10/290,993, filed Nov. 8, 2002, entitled "Adaptive Signal Equalizer with Adaptive Error Timing and Precursor/Postcursor Configuration Control", which is incorporated herein by reference in its entirety. The controllable delay in the present invention is used to align the error signal e(t) with the input signal x1'(t). In one embodiment, the ETC/PPC circuit of the above referenced application is used to adaptively set the delay by using the error signal e(t) as a control input signal.

Figure 5A:
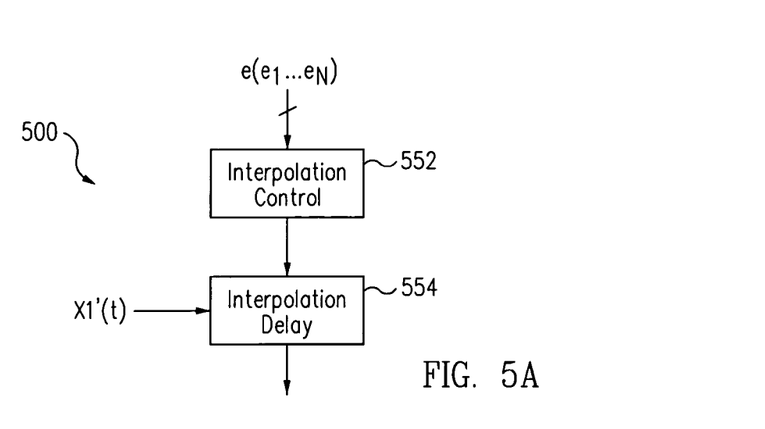
FIG. 5A shows one embodiment of a controllable delay in FIG. 5.

FIG. 5A shows one embodiment of controllable delay 500. Controllable delay 500 includes an interpolation control stage 552 and an interpolation delay stage 554. Interpolation control 552 processes the error signal coefficients to produce a set of delay interpolation control signals for interpolation stage 554. In response to these delay interpolation control signals, interpolation delay stage 554 processes its input signal x1'(t) to produce the corresponding delayed signal for processing by delay elements 502.

Figure 5B:
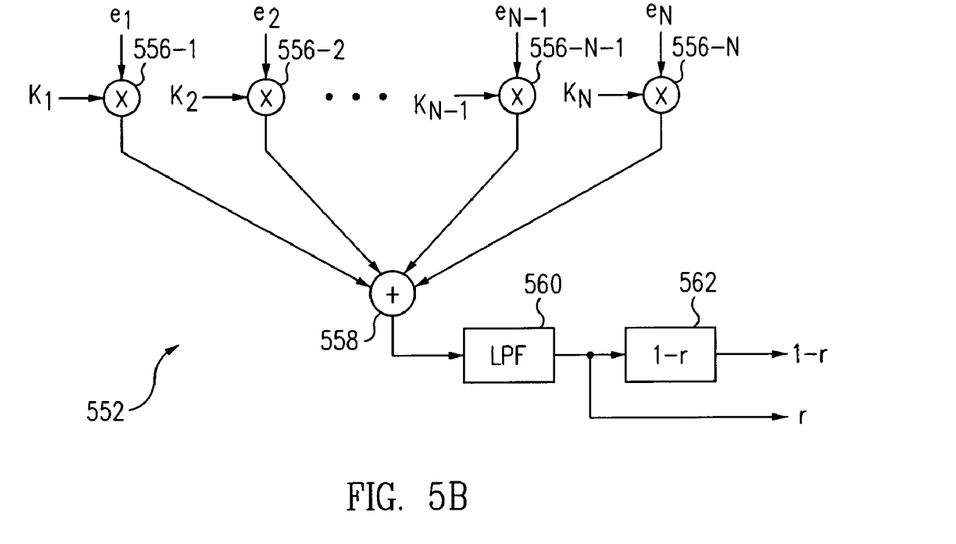
FIG. 5B shows one embodiment of an interpolation control circuit of FIG. 5A.

FIG. 5B shows one embodiment of interpolation controller 552. Interpolation controller 552 includes a set of signal multipliers 556-1 to 556-N, a signal combining circuit 558, a signal integration circuit (e.g., a low pass filter) 560, and a signal complement circuit 562, interconnected substantially as shown. Each of the error signal coefficient signals $e_1$ to $e_N$ is multiplied in a respective multiplier 556-1 to 556-N with a corresponding weighted or scaled signal $K_1$ to $K_N$. In one embodiment, $K_1$ to $K_{N/2}$ are equal to +1, while $K_{(N/2)+1}$ to $K_N$ are equal to −1. The resulting product signals are summed in signal combiner 558. The sum signal is integrated by signal integrator 560 to produce the primary delay interpolation control signal representing the timing control ratio parameter r. This delay interpolation control signal is also complemented by signal complement circuit 562 to provide the complement delay interpolation control signal. Signal complement circuit 562 processes the delay interpolation control signal by subtracting it from a normalized value (e.g., unity) to produce the complement signal. The uncomplemented and complemented signals are then processed by interpolation delay 554.

Figure 5C:
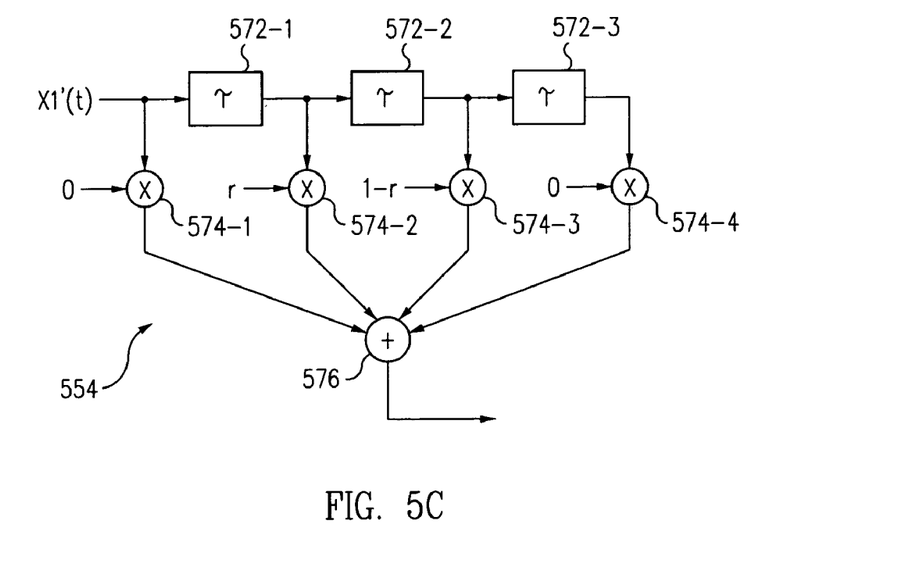
FIG. 5C shows one embodiment of an interpolation delay circuit of FIG. 5A.

FIG. 5C shows one embodiment of interpolation delay 554. Interpolation delay 554 includes three signal delay elements 572-1, 572-2, and 572-3. The incoming signal, i.e., the input signal x1'(t), and the corresponding successively time-delayed versions are multiplied in signal multipliers 574-1, 574-2, 574-3, and 574-4 with corresponding interpolation control signals. The resulting product signals are summed in a signal combiner 576 to produce the delayed version of the incoming signal.

Figure 6:
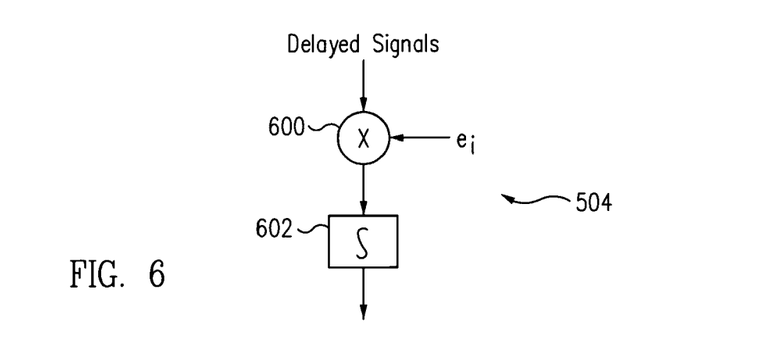
FIG. 6 shows one embodiment of a low pass filter block suitable for use in the system of FIG. 5.

Referring to FIG. 5, the aligned output signal of controllable delay 500 is processed through a series of delay elements 502-1 through 502-N. Delay elements 502 introduce a delay of $\tau'$ to its input signal. In one embodiment, $\tau'$ is greater than the delay $\tau$ of delay elements 402 of FIG. 4, although it may also be suitable for $\tau'$ to be approximately equal to $\tau$ in other embodiments. Having $\tau'>\tau$ results in a generally more robust system. The delayed signals (by multiples of $\tau'$) are input to respective low pass filter blocks 504-1 to 504-N, along with the error signal e(t) from adder 318 of FIG. 3A. Low pass filter blocks 504 multiply each delayed signal with a corresponding error signal and integrate the result to generate individual tap coefficient signals for use by multipliers 404-1 to 404-N of FIG. 4. FIG. 6 shows one embodiment of low pass filter block 504, which includes a multiplier circuit 600 and an integrator circuit, such as a low pass filter 602.

In one embodiment, low pass filters 602 are analog (or continuous-time) first-order low-pass filters having a transfer function $$H(s) = \frac{G}{1 + s \cdot T_l}$$

where G is the gain of the low pass filter and $T_1$ is the leakage time constant. The filter parameters gain G and time constant $T_1$ can be chosen to meet system and component requirements. For example, the time constant $T_1$ is selected as a non-zero positive number for more robust performance with a fractionally-spaced feedforward filter at the front-end. The gain G should be large enough so that the mismatch of the tap coefficient with the least-mean square value at convergence is sufficiently small. Further, $T_1>0$ and G need to be moderate enough to minimize the effects of "tap coefficient drift". Another factor in selecting gain G and time constant $T_1$ is to achieve a convergence time that is sufficiently small for the system.

Selecting values for G and $T_1$ depend on system requirements and include factors such as the maximum steady state mismatch of signals, time variability of the channel, amount of noise within the channel, and parasitic effects of the circuit. In one embodiment, the gain G may be set to 10 to 50 which will result in small mismatch and possibly stable operation. The time constant $T_1$ is typically set to about 10,000 to 100,000 symbol times, in one embodiment. For very fast varying channels, $T_1$ is much smaller. $T_1$ is larger for channels having less temporal variations and more noise. Higher order low pass filters are also suitable for use with the present invention.

Referring back to FIG. 3A, similarly, low pass filter block 316 receives error signal e(t) from adder 318 and the output of slicer output time-align circuit 310. These two signals are then multiplied and integrated by low pass filter block 316.

Figure 7:
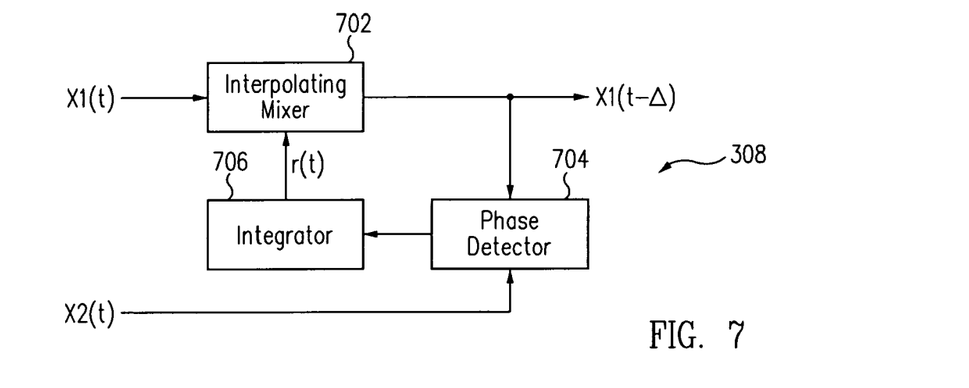
FIG. 7 shows one embodiment of a slicer input time align circuit for use in the system of FIG. 3A.

FIG. 7 shows one embodiment of a timing control circuit for use as timing control circuit 308 of FIG. 3A. The circuit includes a controllable delay, which receives the input data signal x1(t) and introduces a delay Δ into the signal. One type of controllable delay suitable for the present invention is an adaptive least mean square-based timing interpolation (ALTI) circuit, such as described in commonly-owned U.S. patent application Ser. No. 10/321,893, filed Dec. 17, 2002, entitled "Adaptive Signal Latency Control for Communications Systems Signals", which is incorporated herein by reference in its entirety.

The controllable delay in the present invention is used to time align the input signal x1 with the feedback signal x2 from the power amplifier. As used herein, time align can also be described as equalizing the delays between two signals. In one embodiment, the ALTI circuit of the above referenced application is used to adaptively set the delay to align the signals by using the feedback signal x2(t) from the power amplifier. The ALTI block may be used to time-align the input signal to compute the distortion error signal which is the difference between the power amplifier output signal and the input signal, i.e., the time-align circuit 308 delays its output signal to compensate for delays introduced by processing of the input signal by the circuit.

FIG. 7 shows one embodiment of timing control circuit 308, which includes an interpolating mixer 702, a phase detector 704, and a signal integrator 706, interconnected substantially as shown. The feedback signal x2(t) is compared in signal phase by phase detector 704 with the delayed signal from interpolating mixer 702. The resulting detection signal is integrated by signal integrator 706 (e.g., a low pass filter) to produce an interpolation control signal r(t) for interpolating mixer 702.

Figure 7A:
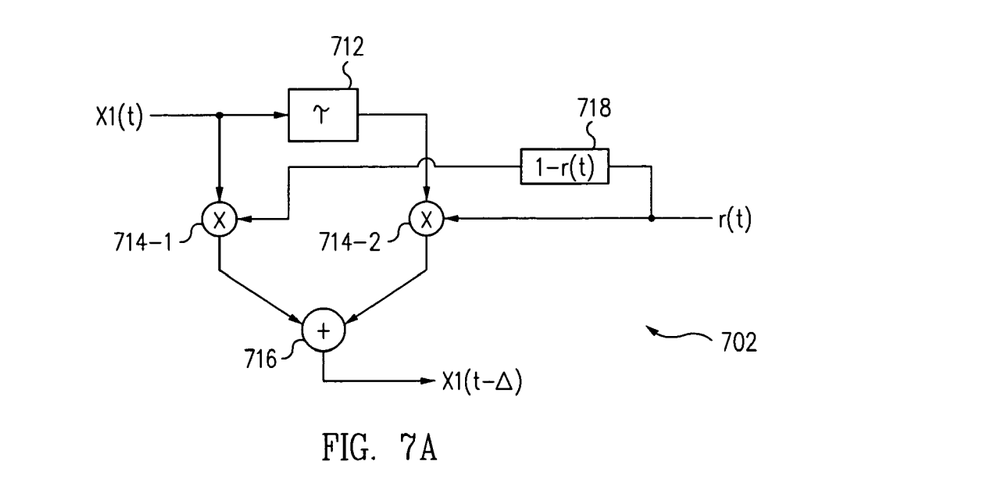
FIG. 7A shows one embodiment of an interpolating mixer circuit of FIG. 7.

FIG. 7A shows one embodiment of interpolating mixer 702, which is implemented as a tapped delay line with correlated tap coefficients. The input signal x1(t) is delayed by a signal delay element 712 which is a fractional delay element introducing a delay which is less than one data symbol period in duration. The resulting fractionally delayed signal and the original input signal x1(t) are mixed (e.g., multiplied) in respective signal mixers 714-1, 714-2 with respective interpolation control signals representing timing interpolation parameters. The first timing interpolation parameter signal is the feedback signal from signal integrator 706 (FIG. 7). This signal is also complemented by a signal complement circuit 718 in which the input signal is subtracted from a normalized value (e.g., unity) to produce the second timing interpolation parameter signal. The resultant mixed signals are combined (e.g., summed) in a signal combining circuit 716 to produce the delayed signal x1(t−Δ).

Figure 7B:
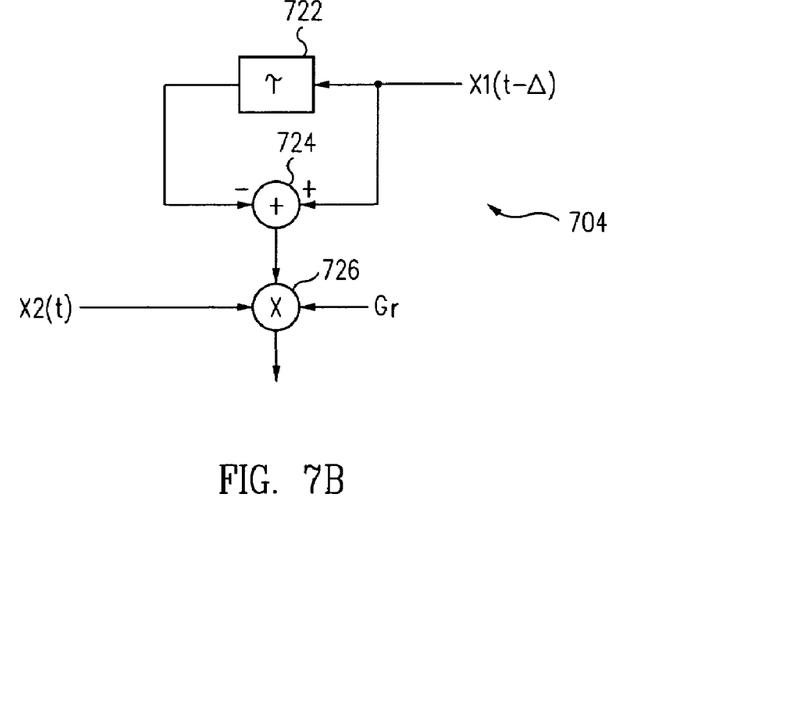
FIG. 7B shows one embodiment of a phase detector circuit of FIG. 7.

FIG. 7B shows one embodiment of phase detector 704 of FIG. 7, which can be implemented using a fractional delay element 722, a signal combining circuit 724, and a signal mixer 726, interconnected substantially as shown. The delayed signal x1(t−Δ) is further delayed by fractional delay element 722, after which it is combined with delayed signal x1(t−Δ) in signal combiner 724 such that the further delayed signal is subtracted from the input delayed signal x1(t−Δ). The resulting combined signal is mixed (e.g., multiplied) in signal mixer 726 with the feedback signal x2(t) (and a gain constant $G_r$, if desired) to produce the phase detection signal for signal integrator 706 (FIG. 7A).

Figure 8:
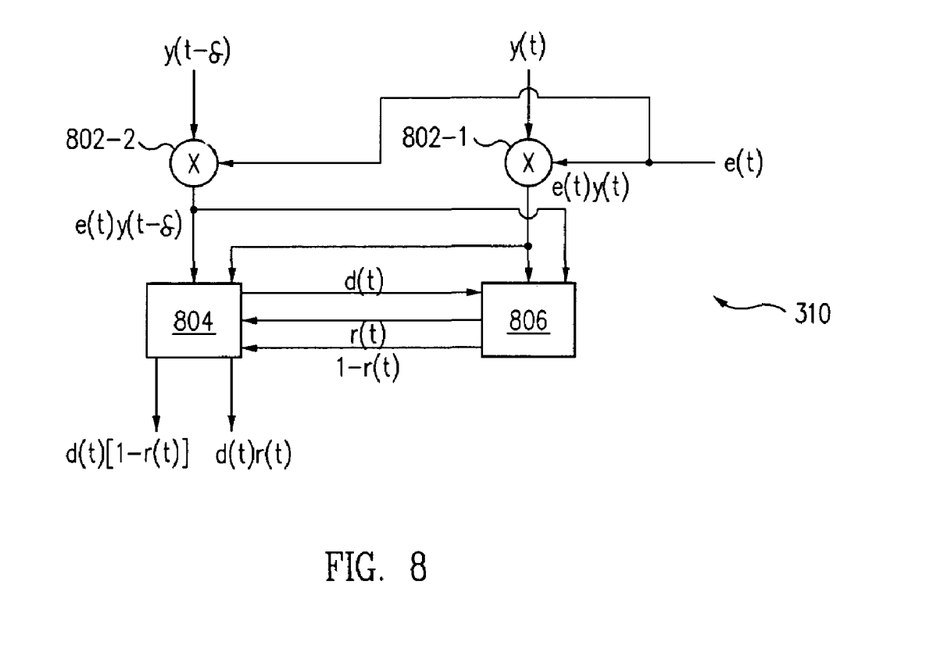
FIG. 8 shows one embodiment of a slicer output time align circuit for use in the system of FIG. 3A.

FIG. 8 shows one embodiment of a slicer output time-align circuit for use as slicer output time-align circuit 310 of FIG. 3A. The circuit includes a controllable delay, which receives the data signal y(t) from slicer 306 of FIG. 3A and introduces a delay into the signal. One type of circuit suitable for the present invention is a fat tap adaptation (FTA) circuit, such as described in commonly-owned U.S. patent application Ser. No. 10/322,024, filed Dec. 17, 2002, entitled "Adaptive Coefficient Signal Generator for Adaptive Signal Equalizers with Fractionally-Spaced Feedback", which is incorporated herein by reference in its entirety.

The controllable delay in the present invention is used to time align the decision feedback signal, which is the signal from slicer 306, to be a symbol period delay with respect to the slicer input signal from which it is cancelled. A method of obtaining this delay in an adaptive manner is by using the FTA block, as described in the above-referenced application, which uses the tap coefficients or error signal e(t) as a control input signal.

FIG. 8 shows one embodiment of slicer output time-align circuit 310, which includes multiplier circuits 802-1, 802-2 and control signal generator circuitry implemented as a coefficient signal generator 804 and a timing interpolation parameter signal generator 806, all interconnected as substantially shown. The adjacent time-delayed feedback signals, the output signal y(t) of slicer 306 (FIG. 3A) and the signal y(t−δ) delayed by a symbol period δ, are multiplied in their respective multiplier circuits 802-1, 802-2 with the error signal e(t). The resulting product signals e(t)y(t) and e(t)y(t−δ) are processed by signal generator circuits 804, 806. Coefficient signal generator circuit 804 provides an adaptation control signal d(t) to timing interpolation parameter signal generator circuit 806, which in return, provides two other adaptation control signals r(t) and 1−r(t) back to coefficient signal generator 804. As a result of processing these input signals e(t)y(t), e(t)y(t−δ), r(t), and 1−r(t), coefficient signal generator 804 provides the adaptive coefficient signals d(t)r(t) and d(t) [1−r(t)], where signal element d(t) is the weighting factor and signal element r(t) is the factor indicative of the degree of correlation between the adjacent time-delayed feedback signals y(t) and y(t−δ).

Figure 8A:
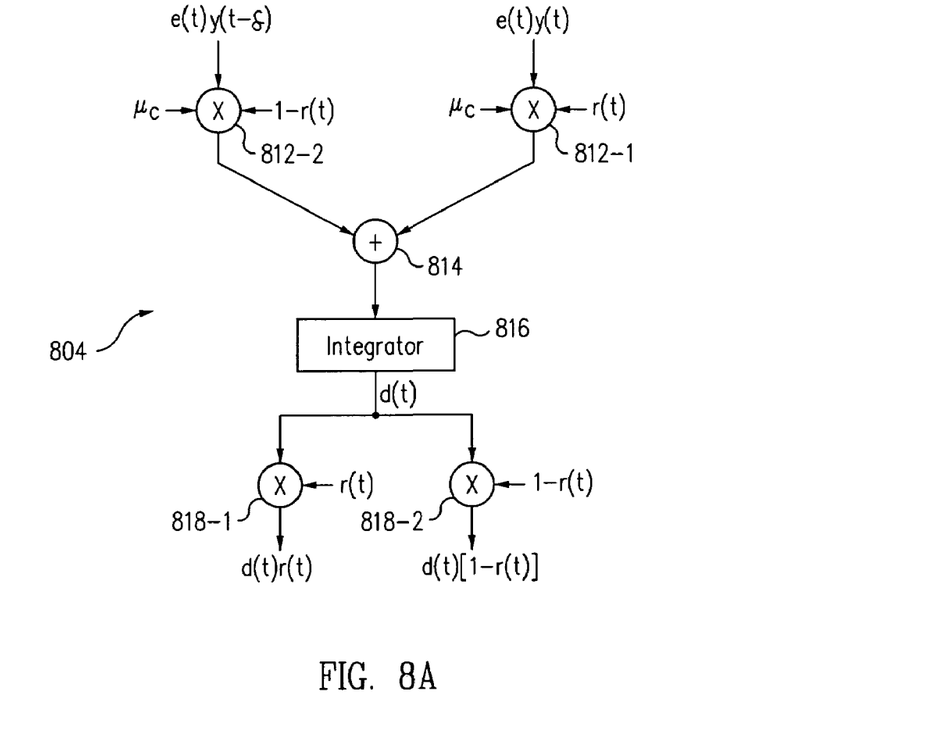
FIG. 8A shows one embodiment of a coefficient generator circuit of FIG. 8.

FIG. 8A shows one embodiment of coefficient signal generator 804. Initial product signals y(t) and y(t−δ) are further multiplied in multiplier circuits 812-1, 812-2 with the adaptation control signals r(t) and 1−r(t), respectively, from timing interpolation parameter signal generator 806. An additional constant signal $\mu_c$ can also be multiplied as part of the product operations or implemented as a constant scaling factor within the multiplier circuits 812-1, 812-2.

The resulting product signals are summed in a signal summing circuit 814. The resulting sum signal is integrated in an integration circuit 816 (e.g., a low pass filter) to produce the first adaptation control signal d(t). This adaptation control signal d(t), in addition to being provided to timing interpolation parameter signal generator 806, is multiplied within multiplier circuits 818-1, 818-2 with the other adaptation control signals r(t) and 1−r(t), respectively, provided by timing interpolation parameter signal generator 806. The product signals resulting from these multiplication operations are the adaptive coefficient signals d(t)r(t) and d(t) [1−r(t)].

Figure 8B:
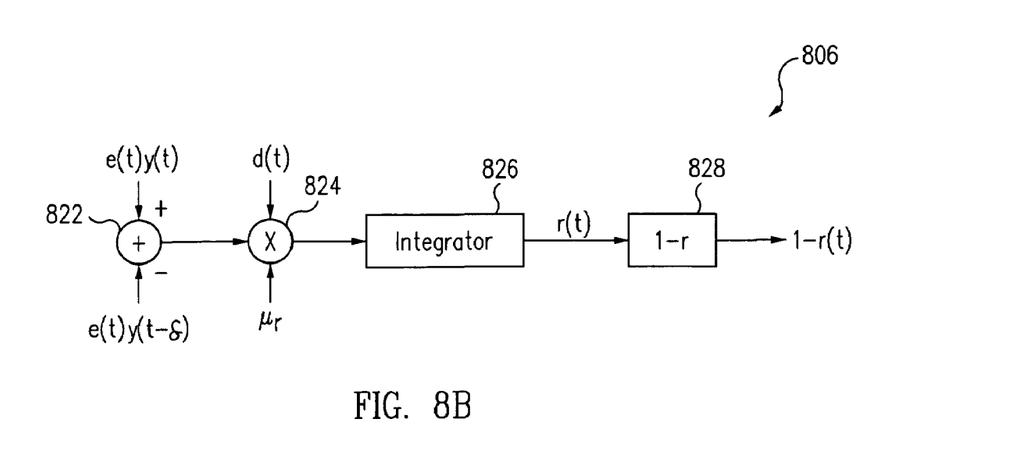
FIG. 8B shows one embodiment of a timing interpolation parameter signal generator circuit of FIG. 8.

FIG. 8B shows one embodiment of timing interpolation parameter signal generator 806. The initial product signals e(t)y(t) and e(t)y(t−δ) are differentially summed in a signal summing circuit 822, where the second product signal e(t)y(t−δ) is subtracted from the first product signal e(t)y(t). The resulting difference signal is multiplied in a multiplier circuit 824 with the adaptation control signal d(t) provided by coefficient signal generator 804. As with the multiplier circuits 812-1, 812-2 of coefficient signal generator 604, an additional constant signal $\mu_r$ can also be used in this multiplication operation or implemented as a constant scaling factor within multiplier circuit 824 operation.

The resulting product signal is integrated by a signal integration circuit 826 (e.g., a low pass filter) to produce one of the adaptation control signals r(t) used by coefficient signal generator 804. This adaptation control signal r(t) is further processed by a signal complement circuit 828, in which the input signal r(t) is subtracted from a reference signal having a normalized value, with the resulting difference signal 1−r(t) serving as the other adaptation control signal used by coefficient signal generator 804. For example, if the value of the incoming signal r(t) were considered to have a normalized signal value range bounded by the values of zero and one, signal complement circuit 828 subtracts the incoming signal r(t) from the value of one to produce the output signal 1−r(t).

The above described embodiment utilizes an adaptive pre-distortion circuit with feedback circuitry and both linear and non-linear elements. By selecting the appropriate parameters for the low pass filters, the convergence of the least mean square value can be controlled to prevent coefficient drift of the adaptive tap coefficients. The continuous time iterative process results in the ability to adaptively change the tap coefficients for error minimization and provide a linear signal out of a non-linear power amplifier.

Figure 9:
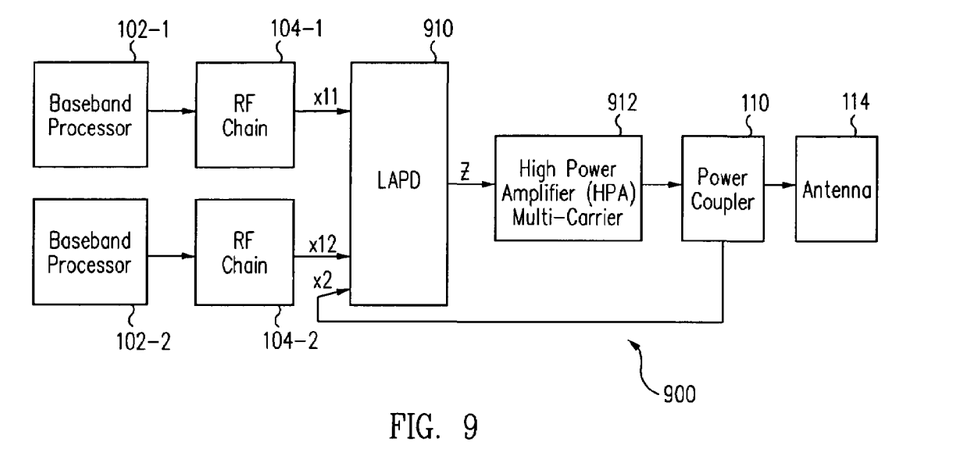
FIG. 9 shows a block diagram of a multi-carrier transceiver with adaptive pre-distortion according to one embodiment.

While the above description is for a single-carrier transceiver, the present invention can also be used with multi-carrier transceivers. FIG. 9 shows a block diagram of a transceiver 900, in which multi-carrier adaptive pre-distortion is performed by a multi-carrier LAPD circuit 910. In this example, there are two carriers. Transceiver 900 includes two baseband processors 102-1 and 102-2, each followed by two RF circuits 104-1 and 104-2, LAPD circuit 910 that receives the outputs x11 and x12 from RF circuits 104-1 and 104-2, respectively, and a feedback signal x2 from a multi-carrier power amplifier 912 via power coupler 110. Amplitude control circuit 112 (not shown) may be coupled between power coupler 110 and LAPD circuit 910 in some embodiments. A linearized signal out of power amplifier 912 can be transmitted through antenna 114.

Figure 10:
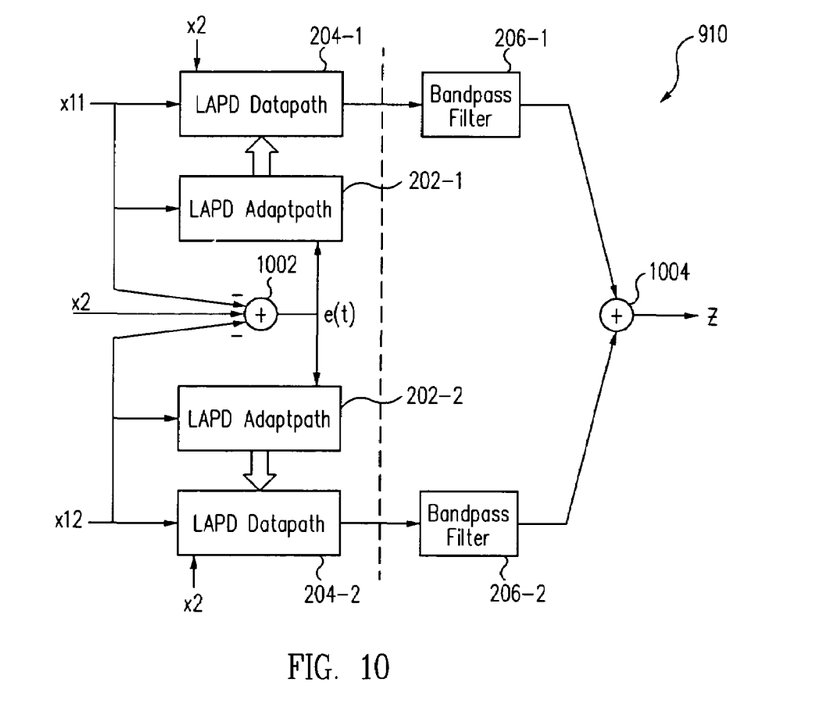
FIG. 10 show a block diagram of a multi-carrier pre-distortion circuit of FIG. 9 according to one embodiment.

FIG. 10 is a block diagram of multi-carrier LAPD circuit 910 of FIG. 9, according to one embodiment. LAPD circuit 910 includes two "branches", one for each signal at a different carrier. The input signal x11 from the first carrier is utilized by a first branch, which includes LAPD adaptpath circuit 202-1 and LAPD datapath circuit 204-1, such as described above with respect to a single carrier LAPD circuit. The input signal x12 from the second carrier is utilized by a second branch, which includes LAPD adaptpath circuit 202-2 and LAPD datapath circuit 204-2, again as described above with respect to FIGS. 3A and 3B according to one embodiment. The error signal e(t) is input to LAPD adaptpath circuits 202-1 and 202-2 for adaptive processing, as described above. However, a difference with the single-carrier LAPD circuit is that the error signal for multi-carrier LAPD 160 is the difference between power amplifier feedback signal x2 and all the different input signals (x11 and x12 in this example), instead of just a single carrier input signal x1. This difference or error signal is determined by an arithmetic circuit 1002, such as a multi-input adder.

After adaptively generating a pre-distortion signal for each carrier, the output signals from LAPD datapath 204-1 and from LAPD datapath 204-2 are passed through bandpass filters 206-1 and 206-2, respectively. As with the single-carrier embodiment, bandpass filters 206 may be internal to or external of multi-carrier LAPD circuit 910. The output signals from bandpass filters 206-1 and 206-2 are then summed by an adder 1004 to generate a pre-distorted signal z for power amplifier 912. Due to adaptively pre-distorting input signals according to the present invention, the output of a non-linear power amplifier can be made linear with a wider range of factors, as well as at lower cost and size.

In some applications and systems, the power amplifier and/or other RF components may introduce inter-symbol interference (ISI) in addition to non-linearity. To compensate for both ISI and non-linearity effects jointly, the present invention can be modified, in part, by using a larger number of taps N' such that $N'*\tau > T_s$.

The above-described embodiments of the present invention are merely meant to be illustrative and not limiting. It will thus be obvious to those skilled in the art that various changes and modifications may be made without departing from this invention in its broader aspects. For example, although the multi-carrier mode is shown with two carriers, the invention can also be used with a multi-carrier transceiver having more than two carriers by modifying the above descriptions accordingly. Further, the above description has focused on continuous-time, RF domain signal processing; however, the present invention can be extended or modified for use with discrete-time signal processing architectures as well. Therefore, the appended claims encompass all such changes and modifications as fall within the true spirit and scope of this invention.

What is claimed is:

1. A pre-distortion circuit, comprising:

an adder coupled to receive a feedback signal from a non-linear power amplifier and a first signal, wherein the adder generates a difference signal between the feedback signal and the first signal, wherein the first signal is a signal to be transmitted that has its delay equalized with a delay of the feedback signal;

an adaptive coefficient generator configured to receive the difference signal and a second signal, wherein the second signal is a version of the signal to be transmitted, and wherein the adaptive coefficient generator generates a set of tap coefficients; and a timing and filter circuit configured to receive the feedback signal and the signal to be transmitted and generate the first signal and receive the tap coefficients and generate a pre-distorted output signal based on a mean square error; and an adaptive automatic gain control circuit configured to receive the signal to be transmitted and provide the second signal.

2. The circuit of claim 1, further comprising a bandpass filter coupled to receive the output signal.

3. The circuit of claim 1, wherein the pre-distortion circuit provides a continuous time adaptation for the power amplifier.

4. The circuit of claim 1, wherein the adaptive coefficient generator equalizes the delay of the second signal.

5. The circuit of claim 1, wherein the power amplifier is a single-carrier power amplifier.

6. The circuit of claim 1, wherein the power amplifier is a multi-carrier power amplifier.

7. A pre-distortion circuit, comprising:
an adder coupled to receive a feedback signal from a non-linear power amplifier and a first signal, wherein the adder generates a difference signal between the feedback signal and the first signal, wherein the first signal is a signal to be transmitted that has its delay equalized with a delay of the feedback signal;
an adaptive coefficient generator configured to receive the difference signal and a second signal, wherein the second signal is a version of the signal to be transmitted, and wherein the adaptive coefficient generator generates a set of tap coefficients; and
a timing and filter circuit configured to receive the feedback signal and the signal to be transmitted and generate the first signal and receive the tap coefficients and generate a pre-distorted output signal based on a mean square error, wherein the timing and filter circuit comprises:
a feedforward filter adapted to receive the adaptive tap coefficients and the second signal to provide a filter output signal;
a slicer adapted to receive a slicer input signal and provide a slicer output signal;
a slicer timing alignment block adapted to receive the slicer output signal and provide a second output signal; and
a low pass filter adapted to receive the second output signal and the error signal and provide a third output signal, wherein the third output signal is multiplied with the second output signal to provide a feedback signal which is added to the filter output signal to generate the slicer input signal.

8. The circuit of claim 7, wherein the feedforward filter comprises a series of N delay elements, wherein each delay element introduces a delay $$\tau = \frac{T_s}{N-1},$$

where $T_s$ is a symbol period and N is an integer greater than 1, wherein $T_s$ is greater than zero.

9. The circuit of claim 7, wherein the feedforward filter comprises a series of N delay elements, with N being greater than $\tau/T_s$, where $\tau$ is the delay introduced by each delay element and $T_s$ is a symbol period, wherein $T_s$ is greater than zero.

10. The circuit of claim 7, wherein the slicer timing alignment block equalizes the delays between the slicer input signal and the slicer output signal.

11. A pre-distortion circuit, comprising:
an adder coupled to receive a feedback signal from a non-linear power amplifier and a first signal, wherein the adder generates a difference signal between the feedback signal and the first signal, wherein the first signal is a signal to be transmitted that has its delay equalized with a delay of the feedback signal;
an adaptive coefficient generator configured to receive the difference signal and a second signal, wherein the second signal is a version of the signal to be transmitted, and wherein the adaptive coefficient generator generates a set of tap coefficients;
a timing and filter circuit configured to receive the feedback signal and the signal to be transmitted and generate the first signal and receive the tap coefficients and generate a pre-distorted output signal based on a mean square error; and
a timing control circuit configured to receive the signal to be transmitted and the feedback signal and outputs the first signal.

12. An RF transceiver, comprising:
an adaptive pre-distortion circuit configured to receive an RF signal and a feedback signal and adaptively generate a pre-distortion signal; and
a non-linear circuit configured to receive the pre-distortion signal and provide an amplified liner output signal, wherein the adaptive pre-distortion circuit comprises a feedforward filter having a series of N delay elements, wherein each delay element introduces a delay $$\tau = \frac{T_s}{N-1},$$

where $T_s$ is a symbol period and N is an integer greater than 1, wherein $T_s$ is greater than zero.

13. The RF transceiver of claim 12, wherein the non-linear circuit is a high power amplifier.

14. The RF transceiver of claim 12, wherein the non-linear circuit is a low noise amplifier.

15. The RF transceiver of claim 12, further comprising an antenna configured to receive and transmit the linear output signal.

16. The RF transceiver of claim 12, further comprising an antenna configured to receive the RF signal and provide the RF signal to the adaptive pre-distortion circuit.

17. The RF transceiver of claim 12, wherein the adaptive pre-distortion circuit comprises:
an adder coupled to receive the feedback signal and a first signal, wherein the adder generates a difference signal between the feedback signal and the first signal, wherein the first signal is a signal to be transmitted that has its delay equalized with a delay of the feedback signal;
an adaptive coefficient generator configured to receive the difference signal and a second signal, wherein the second signal is a version of the signal to be pre-distorted, and wherein the adaptive coefficient generator generates a set of tap coefficients; and
a timing and filter circuit configured to receive the feedback signal and the signal to be pre-distorted and generate the first signal and receive the tap coefficients and generate the pre-distortion output signal based on a mean square error.

18. The RF transceiver of claim 17, further comprising a bandpass filter coupled to receive the pre-distortion output signal.

19. The RF transceiver of claim 12, wherein the adaptive pre-distortion circuit comprises an adder that provides a difference signal between the RF signal and the pre-distortion signal, wherein the pre-distortion signal is adaptively changed to minimize the difference signal.

20. An RF transceiver, comprising:
- an adaptive pre-distortion circuit configured to receive an RF signal and a feedback signal and adaptively generate a pre-distortion signal;
- a non-linear circuit configured to receive the pre-distortion signal and provide an amplified linear output signal; and
- a second adaptive pre-distortion circuit configured to receive an RF signal on a different carrier frequency and the feedback signal and adaptively generate a second pre-distortion signal.

21. The RF transceiver of claim 20, further comprising a first and a second bandpass filter coupled to receive the pre-distortion and second pre-distortion signal, respectively, and an adder configured to receive the outputs of the first and second bandpass filters.

\* \* \* \* \*